United States Patent
Li et al.

(10) Patent No.: US 10,629,399 B2
(45) Date of Patent: Apr. 21, 2020

(54) OVERVOLTAGE PROTECTION ARRANGEMENT HAVING A PLURALITY OF PLANAR VARISTORS ARRANGED ON A FIRST SIDE OF AN N-CORNERED SUPPORTING PLATE

(71) Applicant: DEHN SE + CO KG, Neumarkt/Opf. (DE)

(72) Inventors: Hongjun Li, Shanghai (CN); Niansheng Xu, Shanghai (CN); Weie Chen, Shanghai (CN)

(73) Assignee: DEHN SE + CO KG, Neumarkt/Opf. (DE)

(*) Notice: Subject to any disclaimer, the term of this patent is extended or adjusted under 35 U.S.C. 154(b) by 0 days.

(21) Appl. No.: 16/306,299

(22) PCT Filed: May 22, 2017

(86) PCT No.: PCT/EP2017/062247
§ 371 (c)(1),
(2) Date: Nov. 30, 2018

(87) PCT Pub. No.: WO2017/211578
PCT Pub. Date: Dec. 14, 2017

(65) Prior Publication Data
US 2019/0295792 A1      Sep. 26, 2019

(30) Foreign Application Priority Data

Jun. 10, 2016   (DE) .................. 10 2016 007 131
Dec. 29, 2016   (DE) .................. 10 2016 015 593

(51) Int. Cl.
*H01H 37/76*   (2006.01)
*H01C 7/12*    (2006.01)
(Continued)

(52) U.S. Cl.
CPC ............ *H01H 37/761* (2013.01); *H01C 7/12* (2013.01); *H01C 7/126* (2013.01); *H01H 71/02* (2013.01);
(Continued)

(58) Field of Classification Search
CPC ...... H01H 37/761; H01H 71/02; H01H 71/08; H01H 2037/762; H01H 37/08;
(Continued)

(56) References Cited

U.S. PATENT DOCUMENTS 5,276,422 A * 1/1994 Ikeda .................. H01H 77/04
                                                        337/28
5,311,393 A * 5/1994 Bird .................... H02H 9/06
                                                        337/144
(Continued)

FOREIGN PATENT DOCUMENTS

CN      104008936 A  *  8/2014  ......... H01H 85/0417
CN      104008936 A     8/2014  ............. H01H 71/20
(Continued)

OTHER PUBLICATIONS

"Electrical Fuse", Feb. 18, 1987, Bosley Sydney Stanley, Entire Document (Translation of GB 2178913). (Year: 1987).*
(Continued)

*Primary Examiner* — Anatoly Vortman
*Assistant Examiner* — Stephen S Sul
(74) *Attorney, Agent, or Firm* — Bodner & O'Rourke, LLP; Gerald T. Bodner; Christian P. Bodner

(57) ABSTRACT

The invention relates to an overvoltage protection arrangement having: a plurality of planar varistors 2, 21, 22, which are arranged on a first side of a supporting plate 7; at least one gas arrester 10; and at least one thermal disconnection device, which is in close thermal contact with at least one of the varistors. The aforementioned components are sur-
(Continued)

rounded by an outer housing 1, and electrical connection means 6, 61 for soldering to a printed circuit board are also provided on the second side of the supporting plate. The varistors 2, 21, 22 have a parallel stack arrangement, which is delimited on each of two opposing sides by an insulating partition wall 3, 31 which can be attached to the supporting plate. Each partition wall has at least one opening for a varistor terminal (62), each varistor terminal being connected to a thermal disconnection device, which in turn comprises a spring-loaded disconnecting lever (80), the respective disconnecting lever being connected at its first end to the respective varistor terminal by a soldered connection (18) and wherein its second end merges into one of the electrical terminals 6, 61 and penetrates through the supporting plate 7. The thermal disconnection device also has an insulating slide 4, whose free end acts on the disconnecting lever (80), wherein the slide runs in recesses in the respective partition wall 3, 31, and a change in the position of the slide can be seen by means of a viewing opening 8 in the outer housing 1.

11 Claims, 16 Drawing Sheets

(51) Int. Cl.
    | | | |
    |---|---|---|
    | *H01H 71/02* | (2006.01) | |
    | *H01H 71/08* | (2006.01) | |
    | *H05K 1/18* | (2006.01) | |
    | *H01T 4/06* | (2006.01) | |
    | *H01T 1/14* | (2006.01) | |
    | *H01H 37/08* | (2006.01) | |

(52) U.S. Cl.
    CPC ............ *H01H 71/08* (2013.01); *H05K 1/181* (2013.01); *H01H 37/08* (2013.01); *H01H 2037/762* (2013.01); *H01T 1/14* (2013.01); *H01T 4/06* (2013.01); *H05K 2201/10022* (2013.01); *H05K 2201/10053* (2013.01); *H05K 2201/10181* (2013.01)

(58) Field of Classification Search
    CPC .......... H01C 7/126; H01C 7/12; H05K 1/181; H05K 2201/10022; H05K 2201/10053; H05K 2201/10181; H01T 4/06; H01T 1/14
    USPC .......................................................... 337/414
    See application file for complete search history.

(56) References Cited

U.S. PATENT DOCUMENTS

| | | | | |
|---|---|---|---|---|
| 6,249,415 | B1* | 6/2001 | Daoud | H01Q 21/50 361/103 |
| 9,640,352 | B2 | 5/2017 | Daum et al. | |
| 2002/0011915 | A1* | 1/2002 | Niino | H01H 37/5436 337/53 |
| 2009/0128978 | A1* | 5/2009 | Vo | H01T 1/14 361/119 |
| 2011/0026184 | A1* | 2/2011 | Tegt | H01T 4/02 361/118 |
| 2011/0032651 | A1* | 2/2011 | Depping | H01H 37/761 361/91.1 |
| 2011/0222199 | A1* | 9/2011 | Ludewig | H01C 7/126 361/91.1 |
| 2014/0327990 | A1* | 11/2014 | Juricev | H01C 7/126 361/14 |
| 2015/0228429 | A1* | 8/2015 | Yang | H02H 9/041 337/407 |
| 2018/0062374 | A1* | 3/2018 | Yang | H01C 7/126 |

FOREIGN PATENT DOCUMENTS

| | | | | |
|---|---|---|---|---|
| CN | 204668940 U | 9/2015 | | H02H 3/08 |
| DE | 3734214 A1 | 4/1989 | | H01C 7/12 |
| DE | 3734214 C2 | 11/1991 | | H01C 7/12 |
| DE | 102008026555 A1 | 12/2009 | | H01T 1/14 |
| DE | 102013005327 A1 | 6/2014 | | H01C 1/022 |
| DE | 102013006052 A1 | 8/2014 | | H01C 7/126 |
| DE | 102015000329 B3 | 5/2016 | | H01C 7/12 |
| EP | 2294589 A1 | 3/2011 | | H01C 7/12 |
| EP | 2738778 A1 | 6/2014 | | H01C 7/102 |
| EP | 2294589 B1 | 10/2015 | | H01C 7/12 |
| GB | 2178913 A | * | 2/1987 | H01H 85/0417 |
| WO | WO2009/147043 | 12/2009 | | H01C 7/12 |

OTHER PUBLICATIONS

Bao, Shugeng; Li, Tianmi; Ren, Yi; Wang, Deyan; Yang, Guohua, "Separating and arc shielding device and small-size high-safety all-mode protection surge protection device", Aug. 27, 2014, Sichuan Zhongguang Lightning Prot Technologies Co Ltd, Entire Document (Translation of CN 104008936). (Year: 2014).*

The Notification Concerning Transmittal of International Preliminary Report on Patentability (Chapter I of the Patent Cooperation Treaty), in English, dated Dec. 20, 2018, which was issued by the International Bureau of WIPO in Applicant's corresponding international PCT application having Serial No. PCT/EP2017/062247, filed on May 22, 2017.

The English translation of the International Preliminary Report on Patentability (Chapter I of the Patent Cooperation Treaty), dated Dec. 11, 2018, which was issued by the International Bureau of WIPO in Applicant's corresponding international PCT application having Serial No. PCT/EP2017/062247, filed on May 22, 2017.

The Written Opinion of the International Searching Authority, in English, dated Sep. 11, 2017, which was issued by the International Bureau of WIPO in Applicant's corresponding international PCT application having Serial No. PCT/EP2017/062247, filed on May 22, 2017.

The International Search Report, in English, dated Sep. 11, 2017, which was issued by the International Bureau of WIPO in Applicant's corresponding international PCT application having Serial No. PCT/EP2017/062247, filed on May 22, 2017.

* cited by examiner

OVERVOLTAGE PROTECTION ARRANGEMENT HAVING A PLURALITY OF PLANAR VARISTORS ARRANGED ON A FIRST SIDE OF AN N-CORNERED SUPPORTING PLATE

The invention in accordance with the preamble of Claim 1 relates to an overvoltage protection arrangement having a plurality of planar varistors arranged on a first side of an n-cornered supporting plate, at least one gas arrester and at least one thermal fuse or thermal disconnection device, which is in close thermal contact with at least one of the varistors, the aforementioned components being surrounded by an outer housing and furthermore means for electrical connection being provided on the second side of the supporting plate for soldering on a printed circuit board An overvoltage protection arrangement located in a housing is already known from CN000204668940U, wherein the arrangement comprises three disk-shaped varistors arranged spatially in series.

A thermal fuse is located between at least two of the disk-shaped varistors arranged spatially in series, which is in close thermal contact with the respective varistor.

The spatial series connection furthermore comprises a gas discharge arrester. Due to the arrangement of the thermal fuse within the sandwich construction of the varistors, only the respective neighbored varistor can be monitored with respect to its thermal behavior. It is not possible to check the state of the gas arrester used. Furthermore, the sandwich arrangement of the varistors results in problems when reaching or ensuring the necessary electrical separation distances.

In principle, in accordance with the prior art cited, the thermal energy of the varistors to be thermally monitored can only be transported to the thermal fuses insufficiently and not quickly enough.

An overvoltage protection arrangement with a plurality of disk-shaped varistors is already known form DE 10 2013 005 327 A1.

These disk-shaped varistors are disposed inside a housing enclosing a cavity and are electrically contacted.

This previously known housing is designed as polygonal body, especially as multi-sided prism, cube, cuboid or tetrahedron and has an opening for the insertion of the disc-shaped varistors, which are each mechanically connected to a portion or part of the inner side wall of the housing and are located there.

The housing can be used to make electrical contacts for the desired parallel connection of the varistors used. Furthermore, large-area connections and the related contact of the varistors with the housing side wall create a good thermal transition for the purpose of discharging heat loss.

With respect to the prior art, reference is made to DE 37 34 214 C2. This document discloses an arrangement with a varistor, the contact surfaces provided on both end faces of the varistor being connected to supply leads and dissipators of the voltage source in order to disconnect the varistor from a voltage source during overheating and wherein a soldering point is provided in one of these leads near the varistor. The varistor itself is located in a bowl-shaped housing, the first of its contact surfaces being in contact with the inside of the bottom surface of the housing and the housing forming or having a terminal. The second side of the contact surface of the varistor is covered with an insulating compound, wherein an electrically and thermally conductive connection exists extending through the insulating compound to the soldered connection point. The soldering point and the connections forming a terminal are located on the surface of the insulating compound facing away from the varistor. A resilient contact tongue of the thermal disconnecting device thus formed is designed as a spiral spring, the outer end of this spiral being connected via the soldering point to the corresponding connecting terminal and the inner end of this spiral to the corresponding mating terminal.

In the context of an increasing integration of assemblies and components at printed circuit board level, problems arise in the arrangement and integration of overvoltage protection devices in such electronic devices. In this respect, the overvoltage protection devices must be designed as small as possible in terms of their installation space and should be suitable for direct PCB mounting. Furthermore, it is necessary to maintain the necessary electrical separation distances despite small dimensions and a rather high packing density. Finally, previously known thermal disconnecting devices must be designed with sufficient sensitivity for the protection of overvoltage elements in the event of overload, although the influence of surrounding heat sources on other electronic assemblies or electronic components should be ruled out as far as possible.

From the above, it is therefore the object of the invention to specify a further developed overvoltage protection arrangement with a plurality of planar varistors arranged on a first side of an n-cornered supporting plate, as well as at least one gas arrester as well as at least one thermal fuse or thermal disconnection device, which can be produced in a simple manner with few components, reduced installation space and at low cost. The arrangement to be created is to be designed as a compact assembly in such a way that it can be used for direct mounting on a printed circuit board. Furthermore, it should be possible to detect with simple means whether the arrangement is functional or whether damage has already occurred due to thermal overload.

The task of the invention is solved pursuant to the combination of features in accordance with Claim 1, wherein the sub-claims represent at least appropriate embodiments and further developments.

The inventive solution is based on an overvoltage protection arrangement known per se, which comprises a plurality of planar varistors arranged on a first side of an n-cornered supporting plate. Moreover, the overvoltage protection arrangement also has at least one gas arrester as well as at least one thermal fuse or a thermal disconnection device. The thermal disconnection device is in known close thermal contact with at least one varistor.

The above-mentioned components are surrounded by an outer housing, which can be formed as a cap. On the second side of the supporting plate there are means for electrical connection provided, e.g. adapted as contact pins, for direct soldering on a printed circuit board.

According to the invention, the varistors form a densely packed, parallel arrangement, hereinafter referred to as stack arrangement. This stack arrangement is delimited on two opposite sides by one insulating partition wall each, which can be mounted on the supporting plate or connected thereto.

Hence, the inner side of the partition wall is connected with the stack arrangement. Each partition wall has at least one opening for a varistor terminal, which is connected to a thermal disconnecting device, which in turn comprises a spring-loaded disconnecting lever. Hence, the outside of the partition wall accommodates the actual thermal disconnection device.

The respective disconnecting lever is at its first end connected with the respective varistor terminal by a soldered connection. With its second end, the disconnecting lever merges into one of the electrical terminals, which in that respect penetrates the supporting plate.

Furthermore, the thermal disconnection device has an insulating slide, whose free end acts on the disconnecting lever, wherein the slide runs in recesses of the respective partition wall. This guiding is configured as a longitudinal guide, so that a sliding movement of the slide can be effected in the direction of the disconnecting lever.

The change of position of the slide, which may for example be designed as a colored plastic component, can be seen by means of a viewing opening in the outer housing, such that the status of the overvoltage protection arrangement in the external housing can be determined.

In a preferred embodiment of the invention, the stack arrangement is formed by three varistors with their longitudinal sides adjoining each other.

In a preferred embodiment, the slide comprises two pins for the guiding reception of one spring element each, wherein the pins run parallel. The pins each receive a coil spring, so that the necessary pretension of the slide is given in the direction of the disconnecting lever.

A gas arrester is located on a partition-free side of the arrangement, which is electrically connected to the varistor stack arrangement.

In an embodiment of the invention, the gas arrester may have a separate thermal and spring force supporting disconnection device.

In a preferred embodiment, the outer housing is connectable to a supporting plate by means of a snap-in locking arrangement.

The disconnection device for the gas arrester comprises at least one, preferably two, torsion springs acting on an disconnecting mechanism.

The slide engages with its free end in the close proximity of the soldered connection between the disconnecting lever and the varistor terminal.

A particular aspect of the invention is that the above described thermal disconnection device is of double and symmetrical design, i.e. that on both outer sides of the explained partition walls corresponding disconnection devices are realized for the L/N- and N/L-branches respectively.

In a further embodiment of the invention, web faces extend from the first side of the supporting plate into sections of the enclosed space to ensure sufficient electrical separation distance.

The outer housing can have the form of an n-angled cube or square.

In an embodiment of the invention, the inner wall of the outer housing has a thermal radiation-reflecting coating or comprises thermal radiation-reflecting properties. This ensures that the thermal disconnection device reacts or responds primarily to heat sources in the housing and not to external heat sources.

The described overvoltage protection arrangement is specifically used as compact, encapsulated circuit board mountable unit, the size of the encapsulation being essentially determined and specified by the dimensions of the varistors used to form the stack.

In the following the invention is described in more detail based on exemplary embodiments and with reference to the attached Figures.

These show:

FIG. 1 a basic circuit diagram of the overvoltage protection arrangement with three varistors and a gas arrester and the respective paths;

FIG. 2 a perspective view of the first embodiment of the invention with removed outer housing;

FIG. 3 a perspective exploded view of a first embodiment of the invention with parallel stack arrangement of varistors as well as a gas arrester, which, like the varistors, has a separate thermal disconnection device;

FIG. 4 a perspective view of the first embodiment with low temperature soldered connection of the disconnection device in the L/N path in closed state;

FIG. 5 an illustration in according to the one of FIG. 4, however in disconnected state 19 of the L/N path;

FIG. 6 a perspective view of the first embodiment of the invention with low temperature isolating distance in the N/L path in disconnected state 18".

FIG. 7 an illustration similar to the one according to FIG. 6, however in disconnected state 19' of the N/L path;

FIG. 8 a perspective view of the first embodiment of the invention with thermal disconnection device for the gas arrester in closed state;

FIG. 9 an illustration similar to the one according to FIG. 8, however in disconnected state 15' (arrow display);

FIG. 10 a basic circuit diagram of an embodiment of the overvoltage protection arrangement with thermal disconnection device for varistors only, i.e. without thermal disconnection of the gas arrester and the wiring in the L/N, N/L and PE paths;

FIG. 11 a perspective view of the second embodiment of the invention, i.e. the one having a gas arrester without thermal disconnection device;

FIG. 12 a perspective exploded view of the embodiment with a gas arrester without separate thermal disconnection device;

FIG. 13 an illustration in accordance with the second embodiment with closed thermal disconnection device 230 in the L/N path;

FIG. 14 an illustration similar to the one according to FIG. 13, but in disconnected state 240 (arrow display) of the L/N path;

FIG. 15 a perspective view of the disconnection device according to the second embodiment with closed disconnection device 230' in the N/L path and FIG. 16 an illustration similar to the one according to FIG. 15, but in disconnected state 240' of the N/L path.

FIG. 1 shows a basic circuit diagram of the first embodiment of the invention with three varistors and a gas arrester, wherein in the L/N path and in the N/L path there is in each case a thermal disconnection device for the varistors and in the direction PE a thermal disconnection device for the gas arrester provided. The energetic effect of the varistors on the corresponding disconnecting devices in path L/N or N/L on the disconnecting side is shown with the symbolic dotted arrows and symbolized in an analogous manner with respect to the gas arrester in direction PE.

The overvoltage protection arrangement in accordance with FIGS. 2 and 3 as well as 11 and 12 is initially based on a supporting plate 7.

This supporting plate 7 consists of a plastic injection molding material. Slot-shaped openings 72 are provided in the supporting plate 7, which serve for feeding through connections 6 and 61.

The corresponding feed-through connections 6 and 61 can be used for direct contacting and soldering on a printed circuit board (not shown).

The overvoltage protection arrangement according to FIGS. 2; 3 and 11; 12 furthermore comprises an embodiment of a plurality of planar varistors 2; 21; 22. These varistors form a parallel stack arrangement.

This parallel stack arrangement is delimited on two opposite sides by one insulating partition wall 3; 31 each, which is mountable on a supporting plate 7.

Each partition wall 3; 31 has at least one opening for a varistor terminal 62, which is connected with one thermal disconnection device each.

These thermal disconnection devices comprise a spring-loaded disconnecting lever 80.

The respective disconnecting lever 80 is connected at its first end with the respective varistor terminal 62 by the soldered connection 18 in path L/N or path N/L 20, respectively.

At its second end, the respective disconnecting lever 80 merges into one of the electrical terminals 6 (path L/N), which penetrates through the supporting plate 7.

The thermal disconnection device furthermore comprises an insulating slide 4, whose free end acts on the disconnecting lever 80, wherein the slide 4 runs in recesses 81 of the respective partition wall 3.

A change of position of the slide 4 can be seen by means of a viewing opening in the outer housing 1 having the form of a window 8.

The slide 4 furthermore comprises two pins for guiding reception of one coil spring 5 each.

The arrangement comprises at its partition-free side a gas arrester 10, which is electrically connected to the varistor stack arrangement pursuant to FIG. 1 or FIG. 10 in accordance with the second embodiment.

The gas arrester 10 has a separate thermal and spring force supporting disconnection device.

In this respect, the disconnection device for the gas arrester 10 comprises two torsion springs 9.

As is apparent from FIGS. 2 and 3, the slide 4 engages in the close proximity of the soldered connection point between the disconnecting lever 80 and the varistor terminal 62. FIGS. 2 and 3 additionally reveal recesses 13 in the outer housing 1. The recesses are used to accommodate detent hooks 14 to form a snap-in connection. Reference sign 10 indicates the low-temperature soldered connection of the disconnection device for the gas discharge arrester and reference sign 18 indicates the corresponding low-temperature soldered connection for the disconnection device of the varistors. The torsion springs 9 according to FIG. 3 are pre-loaded and guided by the stub shafts 11 and 12.

Reference sign 16 indicates the separation points electrode on the varistor side and reference sign 17 indicates the separation points electrode on the gas discharge arrester side.

The illustration according to FIG. 11 und 12 comprises a comparable embodiment as illustrated in FIGS. 2 and 3, with the difference that the gas arrester 10 according to FIGS. 11 and 12 has no separate thermal disconnection device with corresponding contact bow and torsion spring 9.

Figure 1:
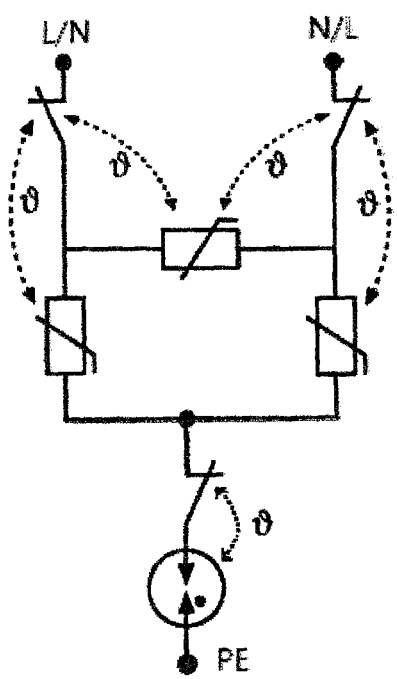
Figure 2:
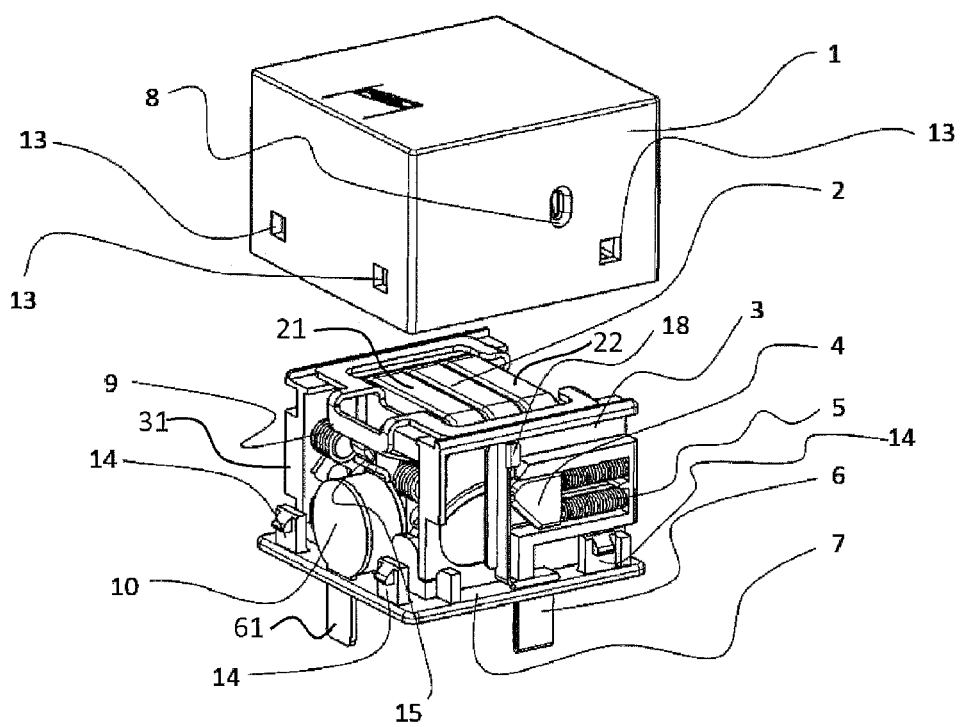
Figure 3:
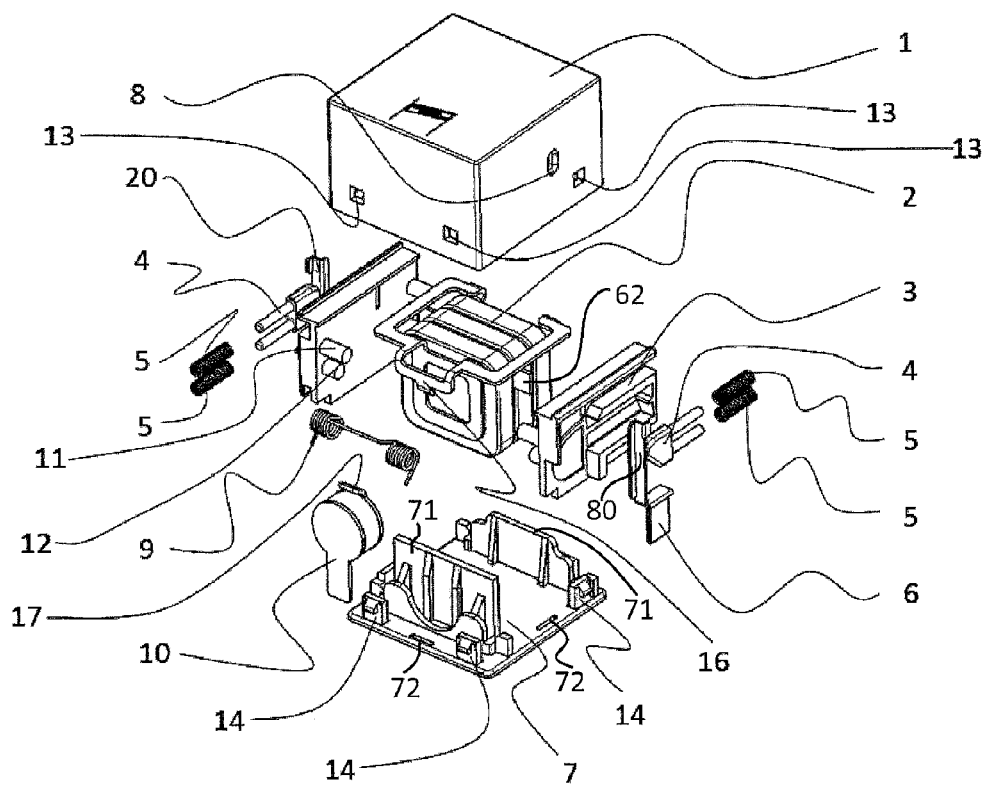
Figure 4:
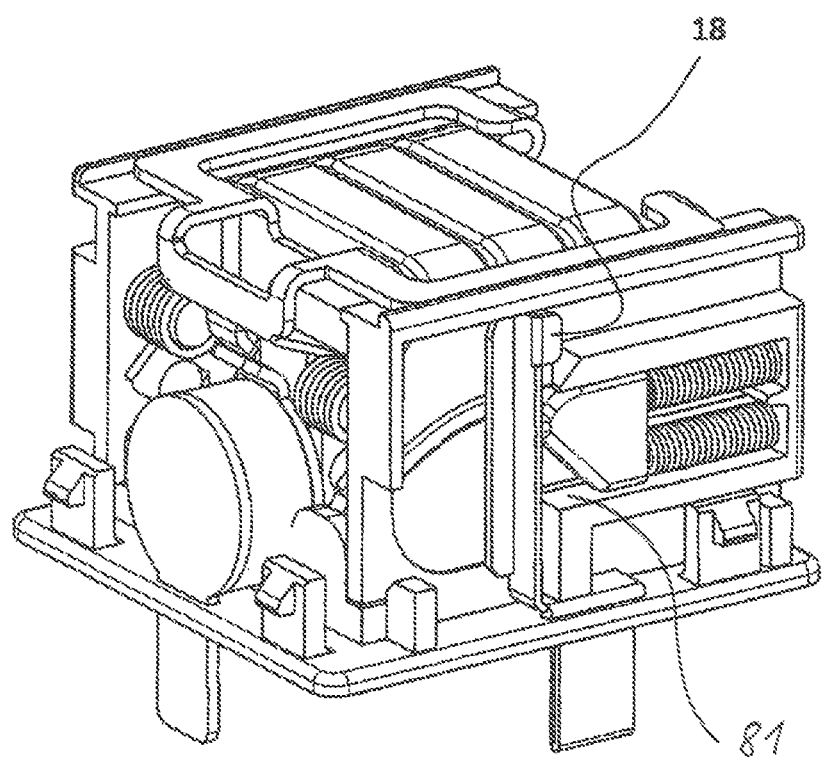
FIGS. 4 and 6 illustrate the thermal disconnection device for varistors in closed state and FIGS. 5 and 7 in open state, e.g. in disconnected state.
Figure 5:
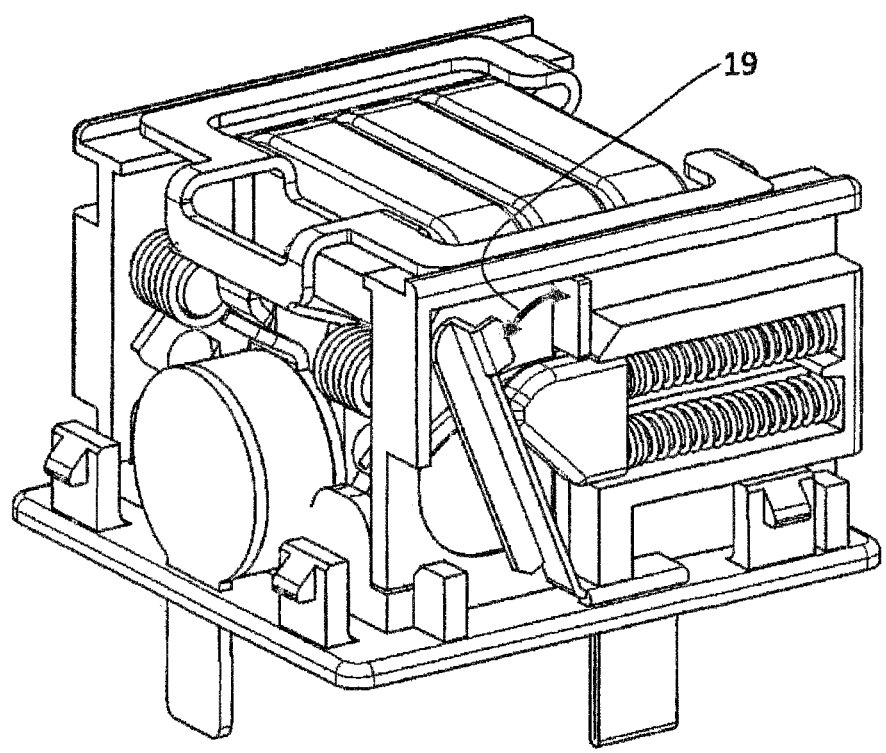
Figure 6:
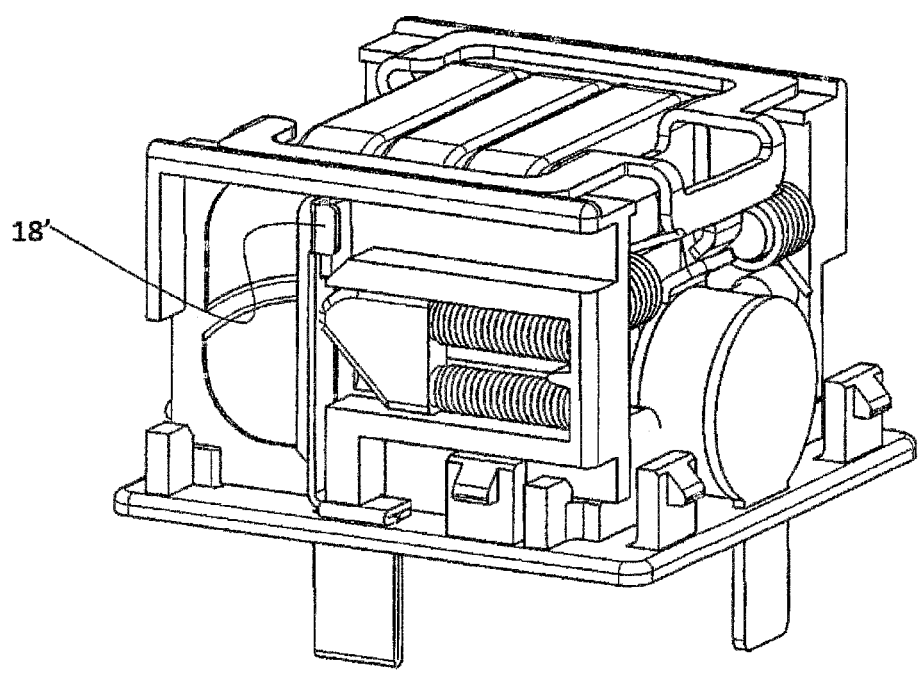
Figure 7:
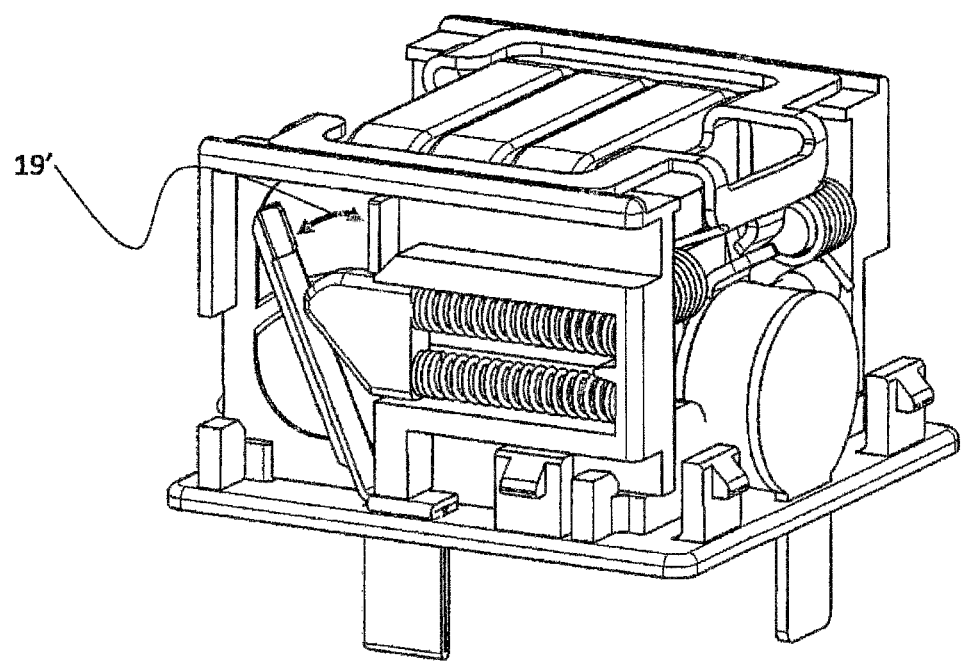
Figure 8:
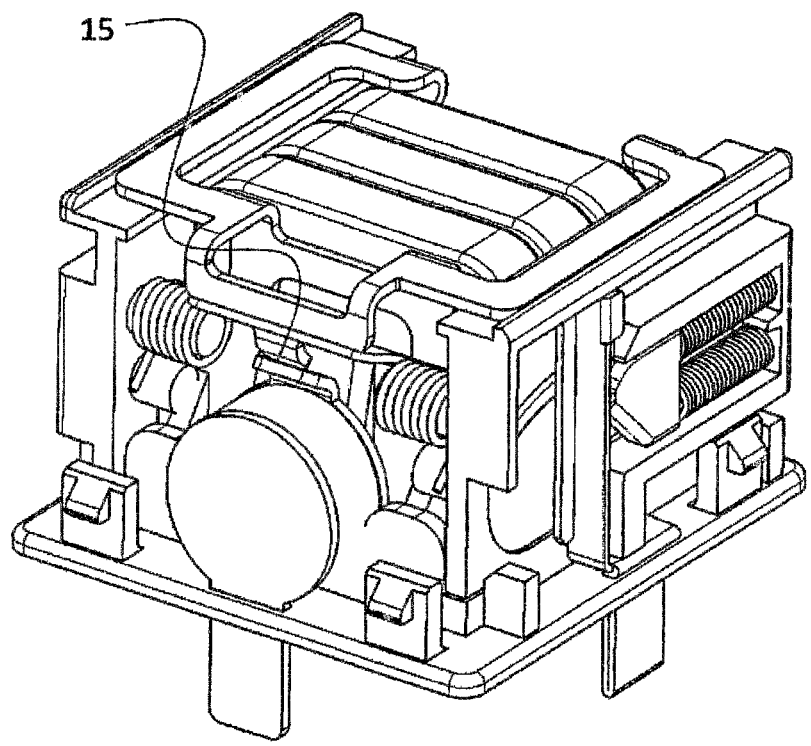
FIG. 8 illustrates the state of the non-disconnected thermal disconnection device for the gas discharge arrester 10 and FIG. 9 the respective disconnected state 15'.
Figure 9:
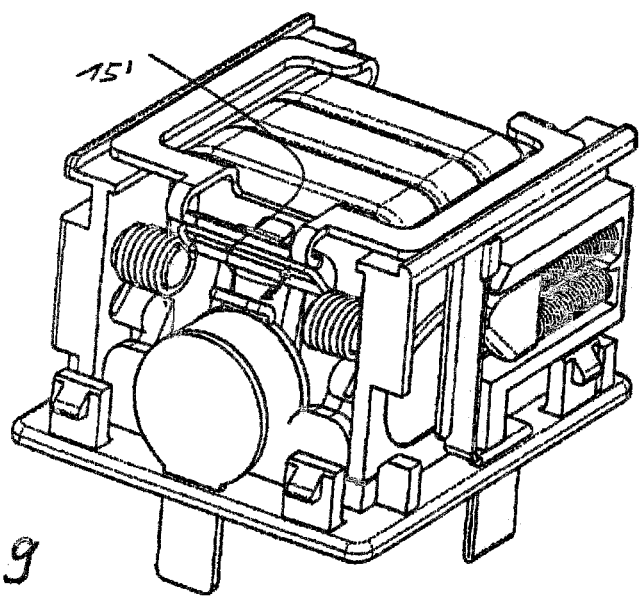
Figure 10:
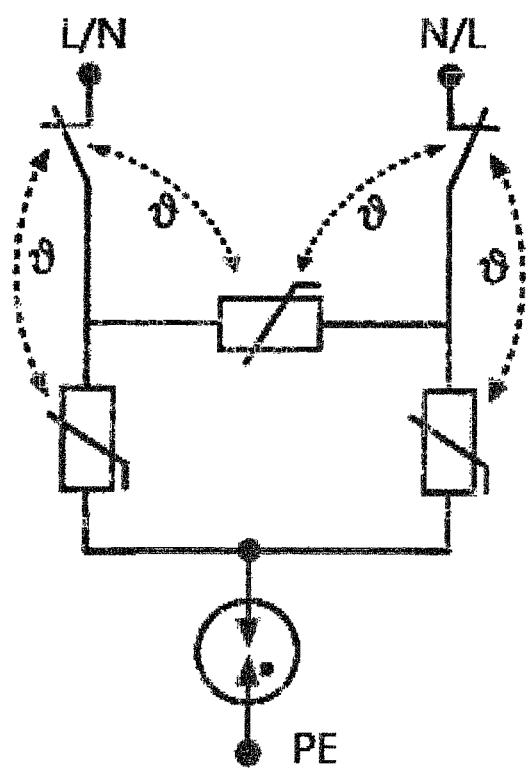
Figure 11:
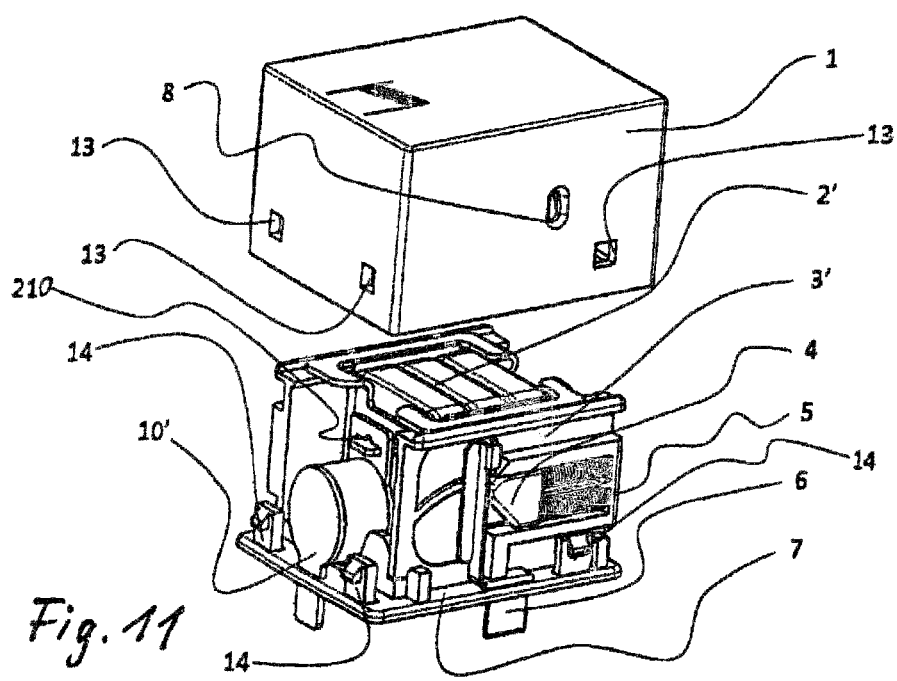
Figure 12:
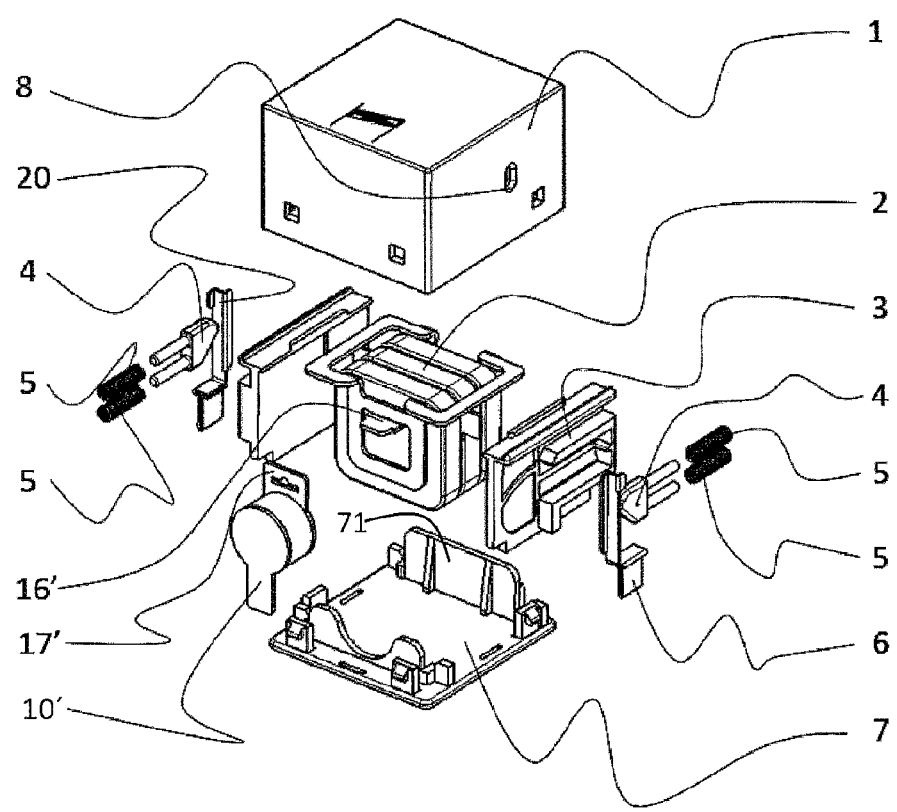

FIG. 10 shows the circuit diagram of the internal wiring in accordance with the second embodiment of the invention, wherein in this embodiment the gas discharge arrester located in PE direction has no separate disconnection device. Instead, normal soldering 210 takes place at the corresponding contact point. The arrangement of the other assemblies, in particular the thermal disconnection devices for varistors 2, corresponds to that according to the first embodiment.

Figure 13:
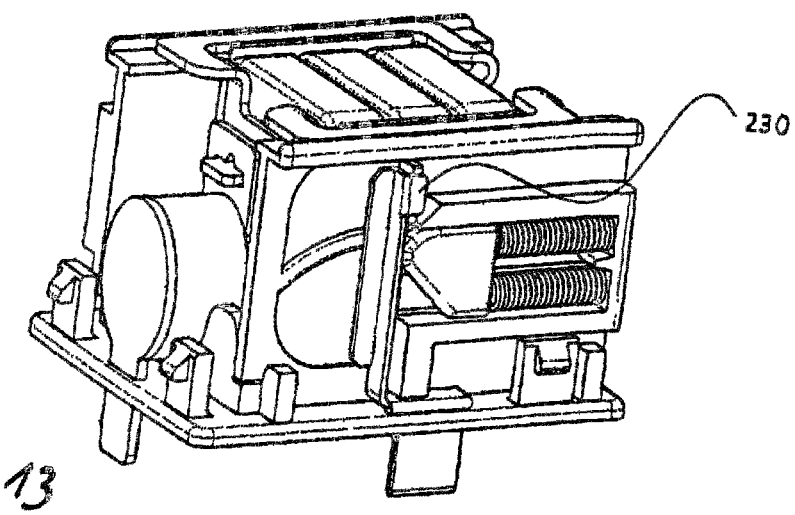
Figure 14:
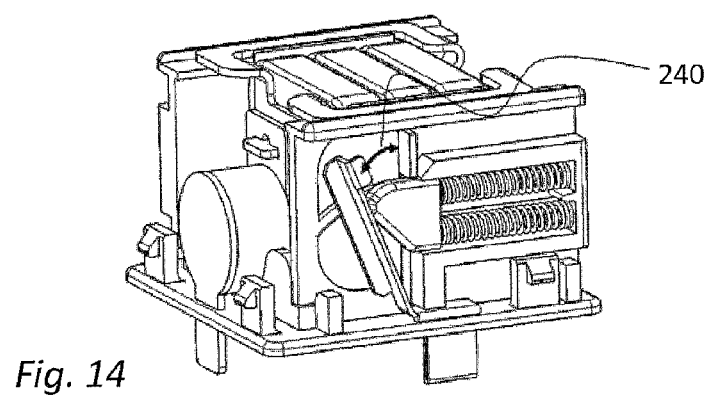
Figure 15:
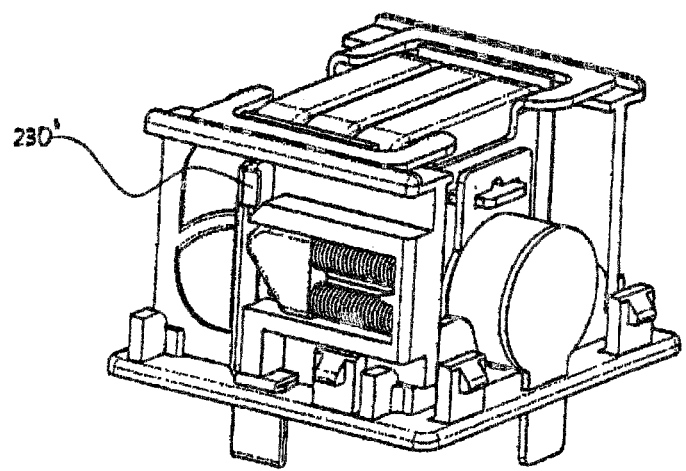
Figure 16:
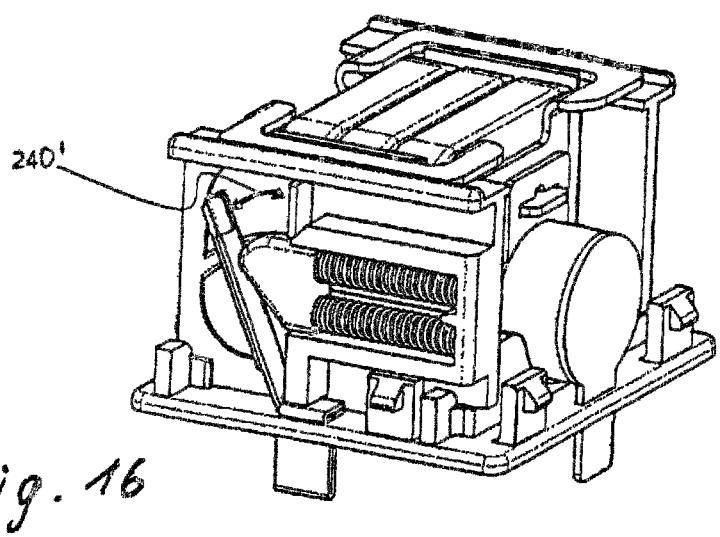

The non-disconnected state 230 and 230' is illustrated in FIGS. 13 and 15 and the disconnected state 240 and 240' is illustrated in FIGS. 14 and 16.

The soldered connection of the gas arrester 10' according to the second embodiment with the electrode 16' of the corresponding varistor 2 is supported by a slot-shaped recess in the connecting part 17' of the gas arrester 10'.

The inner wall of the outer housing 1 can additionally comprise a thermal radiation-reflecting coating and may be adapted to be thermally und electrically insulating.

The invention claimed is:

1. Overvoltage protection arrangement having a plurality of planar varistors (2; 21;22) arranged on a first side of an n-cornered supporting plate (7), at least one gas arrester (10) and at least one thermal fuse or thermal disconnection device, wherein the at least one thermal fuse or thermal disconnection device includes a first thermal disconnection device which is in close thermal contact with at least one of the varistors, the aforementioned components being surrounded by an outer housing (1) and electrical terminals being provided on a second side of the supporting plate (7) for soldering on a printed circuit board,
   characterized in that
   the varistors (2; 21; 22) form a parallel stack arrangement which is delimited on two opposite sides by one insulating partition wall (3; 31) each, which can be attached to the supporting plate (7),
   each partition wall (3; 31) has at least one opening for a varistor terminal (62), which is connected to the first thermal disconnection device, which in turn comprises a spring-loaded disconnecting lever (80), the respective disconnecting lever (80) being at its first end connected with the respective varistor terminal (62) by a soldered connection and wherein its second end merges into one of the electrical terminals (6) and penetrates through the supporting plate (7),
   the first thermal disconnection device has an insulating slide (4), whose free end acts on the disconnecting lever (80), wherein the slide (4) runs in recesses (81) of the respective partition wall (3; 31) and a change of position of the slide (4) can be seen by means of a viewing opening (8) in the outer housing (1),
   characterized in that the at least one gas arrester (10) has a second thermal disconnection device, wherein the second thermal disconnection device is a thermal and spring force supporting disconnection device,
   characterized in that the thermal and spring force supporting disconnection device for the at least one gas arrester (10) comprises at least one torsion spring (9).

2. Overvoltage protection arrangement according to claim 1,
   characterized in that the stack arrangement is formed by three varistors (2; 21; 22) with their longitudinal sides adjoining each other.

3. Overvoltage protection arrangement according to claim 1, characterized in that the slide (4) has two pins for guiding reception of one spring element each, wherein the pins run in parallel.

4. Overvoltage protection arrangement according to claim 1, characterized in that the at least one gas arrester (10) is located on a partition-free side, which is electrically connected to the varistor stack arrangement.

5. Overvoltage protection arrangement according to claim 1, characterized in that the outer housing (1) is connectable to the supporting plate by means of a snap-in locking arrangement (13; 14).

6. Overvoltage protection arrangement according to claim 1, characterized in that the slide (4) engages in close proximity to the soldered connection between the disconnecting lever (80) and the varistor terminal (62).

7. Overvoltage protection arrangement according to claim 1, characterized in that the at least one thermal fuse or thermal disconnection device is of double and symmetrical design.

8. Overvoltage protection arrangement according to claim 1, characterized in that web faces (71) extending from the first side of the supporting plate (7) into sections of an enclosed space to ensure sufficient electrical separation distances.

9. Overvoltage protection arrangement according to claim 1, characterized in that the outer housing (1) has the form of an n-angled cube or square.

10. Overvoltage protection arrangement according to claim 1, characterized in that the inner wall of the outer housing (1) has a thermal radiation-reflecting coating or thermal radiation-reflecting properties.

11. Overvoltage protection arrangement according to claim 1, characterized by its use as a compact, encapsulated circuit board mountable unit, the size of the encapsulation being essentially determined and specified by the dimensions of the varistors used.

* * * * *